United States Patent [19]
Breitmeier

[11] Patent Number: 5,294,768
[45] Date of Patent: Mar. 15, 1994

[54] ELECTRICAL SUPPLY CIRCUIT FOR THE GENERATION OF SEPARATELY CONTROLLABLE CURRENT PULSES

[76] Inventor: Max Breitmeier, Höhenstrasse 89, CH-8115 Hüttikon, Switzerland

[21] Appl. No.: 26,985

[22] Filed: Mar. 5, 1993

[30] Foreign Application Priority Data

Mar. 9, 1992 [CH] Switzerland ............ 00 742/92-0

[51] Int. Cl.$^5$ ............................................. B23K 11/26
[52] U.S. Cl. ............................................. 219/113
[58] Field of Search .......................... 219/108, 110, 113

[56] References Cited

U.S. PATENT DOCUMENTS 3,895,211  7/1975  Pentegov et al. ............... 219/113

FOREIGN PATENT DOCUMENTS 48-24625  7/1973  Japan ............................ 219/113
3-285777 12/1991  Japan ............................ 219/113

Primary Examiner—Clifford C. Shaw
Attorney, Agent, or Firm—Browdy and Neimark

[57] ABSTRACT

The circuit has a transformer on whose primary side there is a storage capacitor which can be charged and discharged in a controlled manner and to whose secondary circuit a load is connected. Two ancillary capacitors of the same capacitance are connected in a circuit between the storage capacitor and the transformer, and the storage capacitor's capacitance is a multiple of the capacitance of each ancillary capacitor. Each ancillary capacitor is connected via a charge-control element to the storage capacitor and via a discharge-control element to the transformer, and forms a parallel resonant circuit with the inductance of its discharge circuit. Control means are connected to the charge- and discharge-control elements in order to alternately and cyclically charge and discharge the ancillary capacitors in a controlled manner. By these means, sequences of partial pulses are generated which, for each sequence, collectively form a current pulse. The cycle frequency of the partial pulses determined by the control means is equal to the natural frequency of said resonant circuits. The circuit can generate either direct-current pulses or, in another embodiment, alternating-current pulses.

14 Claims, 2 Drawing Sheets

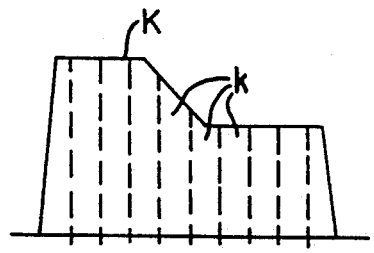
FIG. 3a
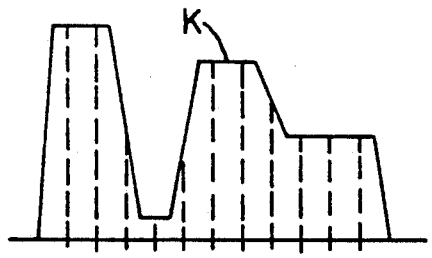
FIG. 3b
FIG. 4
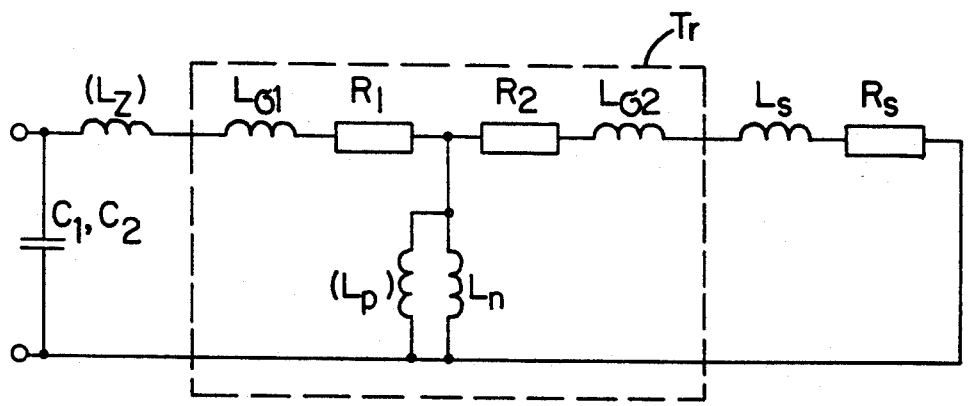
FIG. 5
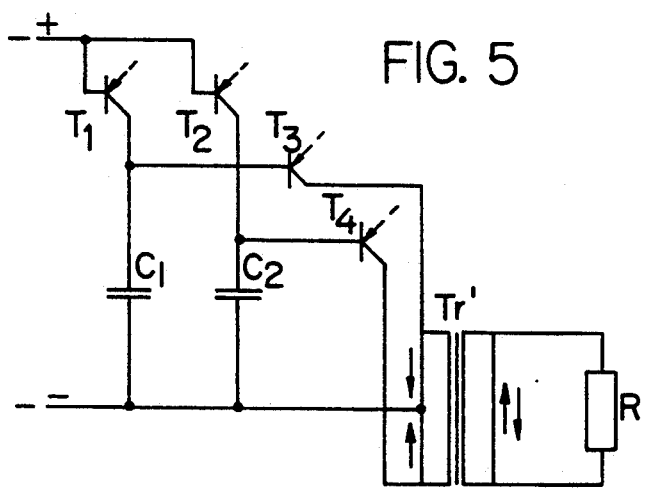

ELECTRICAL SUPPLY CIRCUIT FOR THE GENERATION OF SEPARATELY CONTROLLABLE CURRENT PULSES

BACKGROUND OF THE INVENTION

The present invention relates to an electrical supply circuit for the generation of separately controllable current pulses, in particular for resistance welding, comprising a transformer which has on its primary side a storage capacitor supplied with direct current and charged and discharged in a controlled manner, a load being connected in the secondary circuit of the transformer.

PRIOR ART

High-intensity current pulses of short duration are required for various applications, such as resistance welding. Relatively long currentless intervals occur between succesive pulses, i.e. the effective value of a pulse is a multiple of the effective value of a full cycle (the length of a cycle being the length of the pulse plus the length of the subsequent interval).

Such pulse-by-pulse current consumption has noticeable and potentially inadmissible effects on the supply mains. As a rule, only single-phase current pulses are required. When these are transmitted by a conventional single-phase transformer, only one phase of the mains is under load. Apart from feedback interference in the phase under load, this also generates undesirable asymmetries in multiphase mains.

To keep unwanted retroaction to the supply mains as small as possible, one method known from prior art is to draw the pulse energy from capacitors which are charged during the intervals between the pulses and are then suddenly discharged. Because the charge time is always a multiple of the discharge time, the DC charge current obtained by rectification, which puts the mains under load, is correspondingly smaller than the pulse current, and the current supplied by the mains is correspondingly balanced over a period of time. If the DC charge current is generated by a three-phase rectifier circuit, the phase currents in the mains supply are further reduced and, in addition, the load on the phases is symmetrical.—In this type of circuit, the peak value of the discharge current depends directly on the charge voltage attained at the capacitor. Therefore, by limiting the charge voltage to a given value, a simple means of controlling the energy of each pulse is provided. To date, however, the range of applications for this type of circuit is severely limited, because once the discharge is triggered, it is no longer readily possible to influence its course over the time, i.e. the pulse shape is practically given or defined by the parameters of the discharge side, particularly by the load circuit. Even when a controllable semiconductor is used in the discharge circuit, at best only the rate of the pulse-current rise and fall can be influenced to some extent, but this is always accompanied by a loss of energy in the control element.

However, many applications make it necessary to be able to influence to a much greater extent the form of single pulses, i.e. to control or vary the current over the duration of the pulse. For such requirements, a method known from prior art is to generate the pulses by means of so-called inverter circuits. In these, a multiphase alternating-current voltage from the mains is first rectified and the DC voltage thus obtained is chopped at a frequency higher than the mains frequency by means of a transistor-bridge circuit. The middle-frequency AC current thus generated is then transmitted via a welding-current transformer and rectified by power diodes in the load circuit. The welding pulses are controlled on the primary side of the transformer, i.e. controlled and rectified pulses are generated at the middle-frequency rate, and these, put in a sequence, determine the variation of current over time in the load circuit. In theory, this makes it possible to meet more stringent requirements of time control and of "shaping" the current pulses, but the drawback of pulse-by-pulse energy consumption remains, because the basic rate of the welding-current pulses remains unchanged, i.e. the whole of each pulse load still feeds back into the supply mains. Further disadvantages are the need to use high-current diodes in the load circuit and—at least for many welding applications—the fact that all current pulses thus generated are rectified DC pulses.

SUMMARY OF THE INVENTION

The principal object of the present invention is to propose a supply circuit based on the first type described above, thus retaining the advantages of a storage capacitor-based charge and discharge circuit, but at the same time to provide means of control on the primary side of the transformer and effective means of influencing and programming the shape of the pulses and of controlling the pulse energy.

These objects and others are met according to the invention by a supply circuit wherein two ancillary capacitors of the same capacitance are connected between said storage capacitor and said transformer;

each said ancillary capacitor is connected to the storage capacitor via a charge-control element and to the primary side of the transformer via a discharge-control element respectively, the transformer thus forming part of a discharge circuit for said ancillary capacitors;

the capacitance of the storage capacitor is a multiple of the capacitance of the ancillary capacitors;

each ancillary capacitor together with the inductance of said discharge circuit forms a parallel resonant circuit;

and wherein control means connected to said charge- and discharge-control elements are provided for alternately and cyclically charging and discharging said two ancillary capacitors in a controlled manner, thus generating dense sequences of partial pulses, each such sequence, transmitted via the transformer, forming one of the current pulses to be generated;

whereby said control means are so designed that the cycle frequency of the partial pulses determined by the control means corresponds to the natural frequency of the aforesaid parallel resonant circuits.

In some ways, therefore, the circuit according to the present invention combines the features and technical potential of a capacitor-type charge and discharge system with those of an inverter circuit, as follows:

Because the energy for each pulse generated is provided by the storage capacitor which is recharged during the pulse intervals, the adverse retroaction to the mains reeferred to, caused by sudden cyclical energy consumption, is to a large extent moderated, and the circuit's rated power consumption is reduced approximately in proportion to the pulse-to-interval time ratio. On the other hand, because each partial pulse is quantitatively controlled, the form of the pulse, i.e. its enveloping curve, can be shaped and programmed as required; in particular, the provision of several current stages during the pulse is possible, as well as "cuts" followed by rises in current intensity. The rate of rise and fall of the pulse edges and stages is equal to that of the sympathetic oscillation at the frequency of the partial pulses, which is usually a multiple of the mains frequency, and this makes it possible to generate pulses with very steep edges. Finally, no output or power semiconductors are necessary in the secondary circuit, and, depending on the particular embodiment of circuit, the supply circuit can generate either direct-current pulses from partial pulses of the same polarity, or alternating-current pulses from partial pulses of alternating polarity.

Typical and preferred embodiments of the invention are described in greater detail in conjunction with the accompanying drawings, while the scope of the invention will be pointed out in the appended claims.

2a: of voltage UC at the storage capacitor C;

2b: of voltages UC1 and UC2 at the two ancillary capacitors C1 and C2, but shown at a larger voltage scale than for UC in diagram (a);

2c: of current variation of a sequence of partial pulses, based on assumed constant peak values of the partial pulses;

FIGS. 3a and 3b show two typical pulse forms, i.e. enveloping curves, obtainable by control of the individual partial pulses;

FIG. 4 is a substitute circuit diagram of the discharge circuit common to the two ancillary capacitors; and FIG. 5 is a simplified circuit diagram of a portion of another embodiment of the supply circuit, designed for the generation of alternating-current pulses from partial pulses of alternating polarity.

DETAILED DESCRIPTION OF THE PREFERRED EMBODIMENTS

Figure 1:
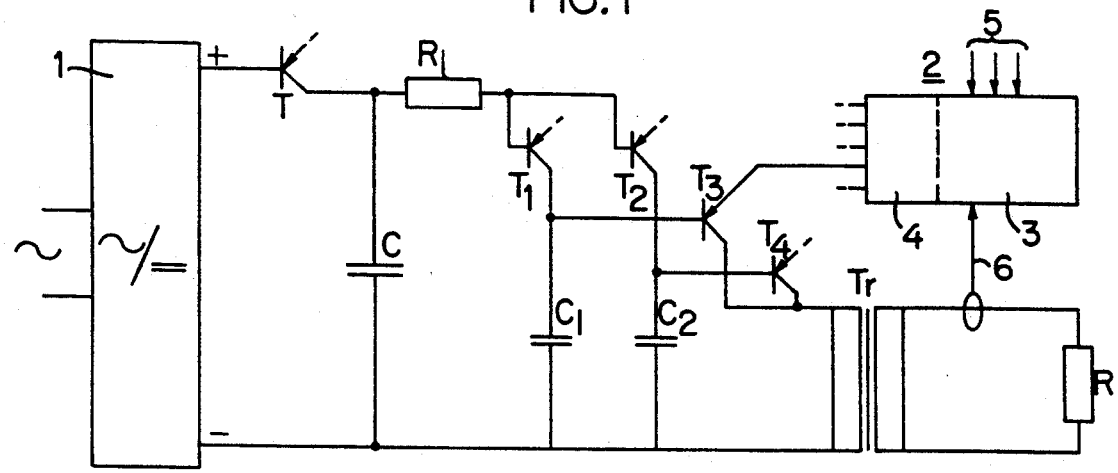
FIG. 1 is a simplified block circuit diagram of a first embodiment of the supply circuit according to the invention.

The supply circuit shown in FIG. 1 comprises on its input side a rectifier unit 1; as a rule, this is supplied from the alternating-current mains. A storage capacitor C is connected to its direct-current output and can be charged in a controlled manner via a suitable control element, preferably a transistor T. On its output side, the supply circuit comprises a transformer Tr, in the secondary circuit of which a load shown as an ohmic resistance R is connected. This may, for example, be the "window" including the welding electrodes of a resistance-type welding machine, particularly for spot-welding, whereby the load for the supply circuit is produced or represented essentially by the welding section between the electrodes.

The supply circuit is used to generate separately controllable current pulses which are transmitted by transformer Tr to the load circuit. Two ancillary capacitors C1 and C2, both of the same capacitance, are provided between the storage capacitor C and the transformer Tr for the generation of the current pulses. The capacitance of the storage capacitor C is a multiple of that of the ancillary capacitors C1 and C2. A common charge resistance $R_1$ and charge-control elements $T_1$ and $T_2$ respectively connect the ancillary capacitors to the storage capacitor, and each ancillary capacitor is also connected via discharge-control elements $T_3$ and $T_4$ respectively to the primary side of the transformer, in the present case to the same end of a single primary winding.

The ancillary capacitors $C_1$ and $C_2$ are charged from the storage capacitor C in a controlled manner in alternating cycles and are likewise discharged via the transformer Tr; charge and discharge cycles are controlled by control means 2, as described in greater detail below. The control electrodes of the control elements $T_1$ to $T_4$ inclusive are connected to the control means 2, as indicated. The control means 2 also govern the periodic charging of the storage capacitor C via transistor Tr. The charge-control elements provided to ensure the controlled charging of the ancillary capacitors should preferably be transistors; the discharge-control elements may be either thyristors or transistors. As described below by reference to FIG. 2, the alternating and cyclic charge and discharge of the two ancillary capacitors generates dense sequences of partial pulses k which are transmitted via the transformer Tr, and each such sequence of partial pulses k forms one of the current pulses K to be generated. In this context it is important that each of the ancillary capacitors $C_1$ and $C_2$ forms a parallel resonant circuit with the inductance of its discharge circuit (for details, see below in connection with FIG. 4), and the cycle frequency $f_k$ of the partial pulses k determined by the control means 2 is equal to the natural frequency of these resonant circuits.

In the typical circuit shown in FIG. 1 and the corresponding diagrams in FIGS. 2 and 3, the partial pulses k have the same polarity, hence the pulses of current K generated on the secondary side are direct-current pulses. For simplicity, the partial pulses k shown in FIG. 2 are assumed to have a constant amplitude for the generation of "square" direct-current pulses K.

Figure 2A:
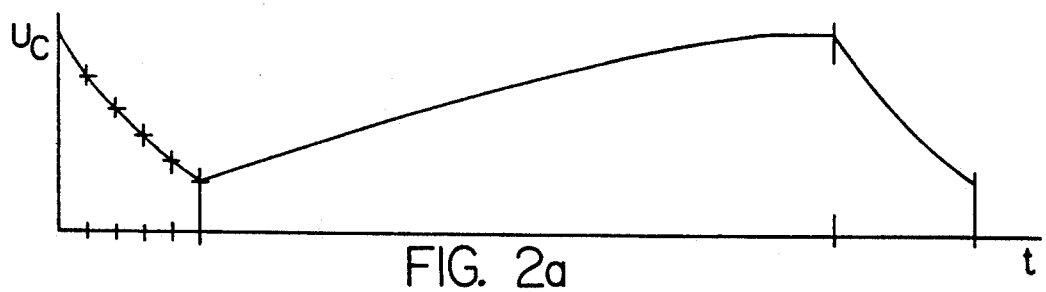
FIGS. 2a, 2b, and 2c show typical variations with time of various values in a circuit made in accordance with FIG. 1, namely.

The time diagram in FIG. 2a shows that during the period $t_K$ of a current pulse to be generated, the storage capacitor C gradually discharges, in time with the partial pulses, from the fully charged state to a residual voltage; during this period the charge transistor T stays blocked due to appropriate control by the control means 2. In the following pulse interval or spacing $t_p$ between two current pulses K, transistor T opens and the storage capacitor is charged by the rectifier unit 1. The charge voltage attained at the end of $t_p$ and the capacitance of the storage capacitor C must always be high enough to ensure that the stored charge is adequate for generating the next current pulse K.

Figure 2B:
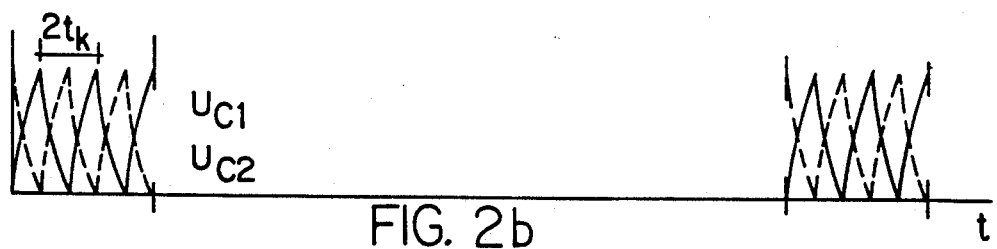
Figure 2C:
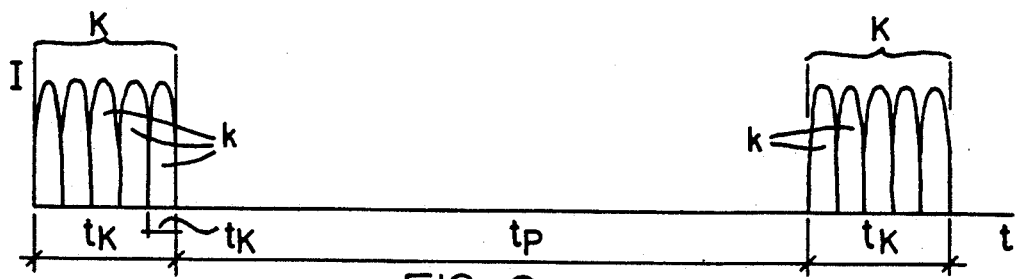

To form a dense sequence of partial pulses (i.e. a pulse sequence without time interval between the individual partial pulses), the ancillary capacitors $C_1$, $C_2$ are charged alternately from the storage capacitor C to a predetermined voltage by the controlled cyclical opening of transistors $T_1$ and $T_2$ respectively. After each individual charging process, also alternately and at the same cycle, the discharge-control elements $T_3$ and $T_4$ are controlled by the control means 2 so as to discharge the ancillary capacitors $C_1$ and $C_2$ respectively via transformer Tr. FIG. 2b shows the corresponding voltages $U_{C1}$ and $U_{C2}$ at $C_1$ and $C_2$ respectively during a sequence of partial pulses k. The progressive drop in the charge voltage at storage capacitor C in FIG. 2a is due to the cyclical charge input and transmission via the two ancillary capacitors. As FIG. 2c shows, each discharge of one of the ancillary capacitors via the transformer generates a partial pulse k, and a sequence of such partial pulses forms the current pulse K. The amplitude of each partial pulse is determined by the charge voltage of the ancillary capacitor that produces it, and by the parameters of the discharge circuit formed by the transformer and the load connected to its secondary side. The duration of each current pulse K is given by the cycle time $t_k$ and the number of partial pulses k in the sequence. Hence, when the number of partial pulses k is preset on the control means 2 at a given cycle frequency, a means for readily controlling the length of the current pulses K is provided.

Control of the amplitude of each partial pulse k makes it possible to define and thus to program the exact form, i.e. the enveloping curve and the variation in time of the current pulses K. This can be done preferably by adapting the control means 2 so as to define, program, and measure the maximum charge voltage at the ancillary capacitors; switching and control equipment known per se is available for this purpose and is therefore not shown or described in detail. In this process, the ancillary capacitors $C_1$, $C_2$ should be charged alternately via transistors $T_1$, $T_2$ in such a manner that the maximum charging period necessary to obtain the required charge voltage of the ancillary capacitors is always slightly less than the cycle time $t_k$ of the partial pulses, even with regard to the fact that the voltage at the storage capacitor C drops during the sequence. This is usually possible by controlling the resistance of the charge transistors $T_1$, $T_2$ and, if necessary, by means of a charge resistance $R_1$ of appropriate size.

Because the energy and amplitude of each partial pulse is determined by the charge voltage set for the ancillary capacitor concerned, it is immaterial if the voltage $U_C$ at the storage condensator fluctuates. It is merely necessary to ensure that, at the beginning of each sequence of partial pulses, $U_C$ is high enough, so that the storage capacitor can hold the whole of the energy of the current pulse to be generated, and that the residual voltage for the last of the partial pulses in the sequence is still high enough to charge the ancillary capacitor sufficiently within the period $t_k$. For the same reason, voltage fluctuations in the mains supply used to charge the storage capacitor do not affect the formation of the partial pulses or of the current pulse K. In principle, the storage capacitor could also be directly and permanently connected to the rectifier unit 1 and its charge control by transistor T omitted. However, the time necessary for taking energy from the mains should be balanced, i.e. the ratio of the effective mains-load current to the effective pulse current should be reduced more or less proportionally to the pulse-to-interval ratio $t_K/t_P$ given by the operation of the equipment to which the current pulses are supplied, such as a spot-welding machine.

FIGS. 3a and 3b show two examples of programmed forms of pulses K, where the total duration of each pulse K is given by the number of partial pulses k in the sequence of pulses, and the form and time variation of the current pulse K are determined by the amplitudes of the successive partial pulses k. These figures show that pulse duration can readily be used to program different stages of current intensity and also to provide for a temporary drop to an intermediate minimum followed by another rise in current intensity.

The control means 2, shown diagrammatically in FIG. 1, should preferably have an input section 3 and a control section 4. In particular, the control lines for the cyclical opening and closing of the control elements T and $T_1$ to $T_4$ inclusive originate in the control section 4. Input lines 5, indicated on the input section 3, are available for parameter input, e.g. preset or programmed pulse length (number of partial pulses) and current intensity, start signals to trigger current pulses, etc. A programming unit as such could, of course, also be connected to or built into the input section 3, notably for programming the pulse form.

It can be particularly useful to continuously sense the instant value of the secondary current of the partial pulses k, as indicated schematically by a signal line 6 from the secondary circuit of the transformer Tr to the input section 3. In the control means 2, this allows a continual comparison of nominal (preset) and effective (instant) values of the secondary current. Based on this, and via the control of the charge voltage of the ancillary capacitors, automatic feedback control of the intensity of the pulse current can be achieved.

As stated above, the frequency of the partial pulses $f_k = 1/(2t_k)$ should be equal to the natural frequency of the resonant circuit formed by each ancillary capacitor and its discharge circuit (The partial pulses k of length $t_k$ should be considered as half-waves, generated alternately by the two ancillary capacitors—and that in the example of FIGS. 1 and 2 of the same polarity—, and hence the discharge period for each of the ancillary capacitors is $2t_k$. For the parallel resonant circuits referred to, the following formula applies:

$$2\pi f_k = \omega = \sqrt{\frac{1}{LC} - \frac{R^2}{4L^2}}$$

where:
C = capacitance of an ancillary capacitor
L = inductance of discharge circuit
R = ohmic resistance of discharge circuit Some of the principal relationships in connection with these resonant circuits and the operation of the supply circuit are considered in greater detail below by reference to the substitute circuit diagram of the discharge circuit according to FIG. 4. In the diagram, the elements $T_3$ and $T_4$ are omitted, because their impedance during discharge can be taken as zero. The symbols in FIG. 4 stand for the following:
$L_{\sigma 1}$, $L_{\sigma 2}$ = primary and secondary leakage inductance
$R_1$, $R_2$ = primary- and secondary-winding resistance
$L_n$ = main inductance of transformer
$L_s$ = inductance of secondary loop
$R_s$ = load and other secondary resistances
$L_z$ = additional inductance on primary side, if any
$L_p$ = parallel inductance, if any By designing the parameters for the discharge circuit and the transformer's winding ratio, the resonant circuit's natural frequency is determined. This should preferably be as high as possible and should in any case be a multiple of the mains frequency, so that the duration $t_k$ of the partial pulses is as short as possible. This results in a small pulse transformer Tr, steep pulse edges, less residual ripple of the current pulses, and the possibility of a wide variety of small steps for shaping the current pulse. It may be readily seen that the maximum rate of increase in current intensity is to a large extent determined by the steepness of the partial pulses and thus again by the resonant circuit's natural frequency.

In determining the natural frequency, the circuit's inductance L can, if necessary, be reduced by introduction of a parallel inductance $L_p$, for example by increasing the size of the air gap in the transformer core, or otherwise the inductance L can be increased by an additional serial inductance $L_z$.

It is particularly desirable to design the resonant circuit's parameters for attenuated periodic oscillations. This is the case when $4L - R^2C < 0$. In this condition, each discharge by one of the ancillary capacitors triggers the first half-wave of such an attenuated oscillation. The control unit can then determine the zero pass at the end of each such half-wave, as indicated by line 6 in FIG. 1, hence the natural frequency of the resonant circuit automatically guides the cyclical control to charging and discharging the ancillary capacitors. If, alternatively, a discharge were to occur as an oscillation at the periodic limit, i.e. if $4L - R^2C = 0$, a threshold voltage would have to be defined for automatic feedback guidance, whereby exceeding of the threshold value by the instant value of the oscillation would have the same effect as the zero pass described above.

It is also desirable to apply to the amplitude of each partial pulse an "internal" control based on determining the instant value in the secondary circuit. For this purpose, the current intensity measured for each partial pulse is used as the basis by which the control means determine the ancillary capacitor's charge voltage for the next partial pulse. This makes it possible to keep the energy flow automatically constant and to guide it in conformance with a programmed gradient, unaffected by voltage fluctuations in the mains supply or by variations in the load resistance, for example in the welding equipment used for spot-welding, or by other changes in the charge circuit which may occur during a current pulse or in an interval between pulses. A high natural frequency of the discharge circuit is also an advantage for the purposes of automatic feedback control.

In the embodiment of the circuit shown in FIG. 5, the input portion up to and including the storage capacitor may be made according to the example of FIG. 1, and is thus omitted from FIG. 5. This version differs from the previous embodiment by having a transformer Tr' whose primary winding has a central tapping. One pole of each of the two ancillary capacitors $C_1$, $C_2$ is connected to the central tapping and the other pole is connected, via the discharge-control elements $T_3$, $T_4$ respectively, to the opposite ends of the two halves of the primary winding. The arrows in FIG. 5 show that when the ancillary capacitors discharge alternately, the direction of the current changes on the primary side and thus also in the secondary circuit, so that the polarity in the sequences of partial pulses k generated alternates. By contrast with the circuit shown in FIG. 1, which is used to generate direct-current pulses, the version shown in FIG. 5 thus generates alternating-current pulses. All other characteristics described in connection with the typical embodiment in accordance with FIG. 1 apply practically unchanged to the embodiment of FIG. 5.

What is claimed is:

1. Electrical supply circuit for the generation of separately controlled current pulses (K), particularly for resistance welding, comprising a transformer (Tr) which has on its primary side a storage capacitor (C) supplied with direct current and charged and discharged in a controlled manner, a load (R) being connected in the secondary circuit of said transformer, wherein two ancillary capacitors ($C_1$, $C_2$) of the same capacitance are connected between said storage capacitor and said transformer;

each said ancillary capacitor is connected to the storage capacitor via a charge-control element ($T_1$, $T_2$) and to the primary side of the transformer via a discharge-control element ($T_3$, $T_4$) respectively, the transformer thus forming part of a discharge circuit for said ancillary capacitors;

the capacitance of the storage capacitor is a multiple of the capacitance of the ancillary capacitors;

each ancillary capacitor together with the inductance of said discharge circuit forms a parallel resonant circuit;

and wherein control means (2) connected to said charge- and discharge-control elements are provided for alternately and cyclically charging and discharging said two ancillary capacitors in a controlled manner, thus generating dense sequences of partial pulses (k), each such sequence, transmitted via the transformer, forming one of the current pulses (K) to be generated;

whereby said control means (2) are so designed that the cycle frequency ($f_k$) of the partial pulses determined by the control means corresponds to the natural frequency of the aforesaid parallel resonant circuits.

2. Supply circuit in accordance with claim 1, wherein said charge-control elements are transistors.

3. Supply circuit in accordance with claim 1, wherein said discharge-control elements are thyristors or transistors.

4. Supply circuit in accordance with claim 1, wherein either a serial ($L_z$) or a parallel ($L_p$) inductance is connected to the transformer for the purpose of determining the resonant circuit's natural frequency.

5. Supply circuit in accordance with claim 1, wherein the maximum charge period of the ancillary capacitors ($C_1$, $C_2$) is rated slightly shorter than a half period ($t_k$) of the resonant circuit's natural oscillation.

6. Supply circuit in accordance with claim 1, wherein said control means are designed for the presetting and measurement of the charge voltage of the ancillary capacitors.

7. Supply circuit in accordance with claim 1, wherein the length of the current pulses (K) is adjustable by presetting of the number of partial pulses (k) at said control means.

8. Supply circuit in accordance with claim 6, wherein the shaping of the current pulses (K) over their duration is determined by programming, within a sequence of partial pulses, the maximum charge voltage ($UC_1$, $UC_2$) of the ancillary capacitors and thus the amplitudes of each partial pulse (k) of said sequence.

9. Supply circuit in accordance with claim 1, wherein said control means have an actual value input (6) influenced by the secondary circuit of the transformer, and are so designed as to perform comparison of the actual and rated values of the secondary current of the partial pulses.

10. Supply circuit in accordance with claim 1, wherein said control means have an input section (3) and a control section (4).

11. Supply circuit in accordance with claim 1, wherein the resonant circuit's parameters are designed for attenuated periodic oscillations and each discharge of one of the ancillary capacitors triggers the first half-wave of such an oscillation.

12. Supply circuit in accordance with claim 11, wherein, for the purpose of automatic cyclic control of the charge and discharge of the ancillary capacitors, said control means have a control input (6) influenced by the secondary circuit of the transformer for determining the zero pass at the end of each first half-wave.

13. Supply circuit in accordance with claim 1, wherein each ancillary capacitor is connected via its respective discharge-control element to the end of a single primary winding of the transformer, in order to generate sequences of partial pulses of the same polarity.

14. Supply circuit in accordance with claim 1, wherein the transformer (Tr') has a primary winding with a central tapping, one pole of the two ancillary capacitors being connected to said central tapping and the other pole being connected, via its discharge-control element, to the opposite ends of the two halves of the primary winding respectively, in order to generate sequences of partial pulses of alternating polarity.

* * * * *